United States Patent
Okada et al.

(10) Patent No.: US 9,995,786 B2
(45) Date of Patent: Jun. 12, 2018

(54) APPARATUS AND METHOD FOR EVALUATING SEMICONDUCTOR DEVICE

(71) Applicant: Mitsubishi Electric Corporation, Tokyo (JP)

(72) Inventors: Akira Okada, Tokyo (JP); Norihiro Takesako, Tokyo (JP); Hajime Akiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 10 days.

(21) Appl. No.: 15/203,846

(22) Filed: Jul. 7, 2016

(65) Prior Publication Data

US 2017/0139002 A1    May 18, 2017

(30) Foreign Application Priority Data

Nov. 17, 2015 (JP) .................................. 2015-224663

(51) Int. Cl.
  *G01R 31/28* (2006.01)
  *G01R 1/04* (2006.01)
  *G01R 31/26* (2014.01)
  *G01R 1/067* (2006.01)

(52) U.S. Cl.
  CPC ....... *G01R 31/2874* (2013.01); *G01R 1/0408* (2013.01); *G01R 1/06794* (2013.01); *G01R 31/2601* (2013.01); *G01R 1/06722* (2013.01)

(58) Field of Classification Search
  CPC .............. G01R 31/2874; G01R 1/0408; G01R 31/2601

USPC .............. 324/500, 750.03, 431, 441, 750.06, 324/750.28, 670, 685, 721, 300, 315
See application file for complete search history.

(56) References Cited

U.S. PATENT DOCUMENTS

| 5,378,971 A * | 1/1995 | Yamashita ................ C22C 5/02 |
| | | 324/72.5 |
| 5,673,028 A * | 9/1997 | Levy ...................... G01D 7/005 |
| | | 116/209 |
| 2007/0229098 A1 | 10/2007 | Kobayashi et al. |
| 2009/0212804 A1* | 8/2009 | Yamada ............. G01R 1/07364 |
| | | 324/755.01 |

(Continued)

FOREIGN PATENT DOCUMENTS

| JP | 05-157790 A | 6/1993 |
| JP | 2000-183137 A | 6/2000 |

(Continued)

*Primary Examiner* — Melissa Koval
*Assistant Examiner* — Trung Nguyen
(74) *Attorney, Agent, or Firm* — Studebaker & Brackett PC

(57) ABSTRACT

An apparatus for evaluating a semiconductor device includes: a chuck stage; an insulating substrate; a plurality of probes; a temperature adjustment unit; an evaluation/control unit; and a probe position/temperature inspection device including an inspection plate, a thermo-chromic material, a photographing unit, and an image processing unit. The photographing unit photographs a color-change image of the thermo-chromic material in a state in which distal end portions of the plurality of probes are pressed against the upper surface of the inspection plate. The image processing unit performs image processing to the color-change image to calculate in-plane positions and temperatures of the distal end portions of the plurality of probes.

15 Claims, 4 Drawing Sheets

(56) References Cited

U.S. PATENT DOCUMENTS

| | | | |
|---|---|---|---|
| 2013/0244351 A1 | 9/2013 | Yamashita et al. | |
| 2015/0371579 A1* | 12/2015 | Yu .......................... | G09G 3/32 |
| | | | 345/690 |
| 2016/0109508 A1 | 4/2016 | Akaike et al. | |

FOREIGN PATENT DOCUMENTS

| | | |
|---|---|---|
| JP | 2001-189353 A | 7/2001 |
| JP | 2002-196017 A | 7/2002 |
| JP | 2005-079253 A | 3/2005 |
| JP | 2007-036165 A | 2/2007 |
| JP | 2007-273631 A | 10/2007 |
| JP | 2009-198407 A | 9/2009 |
| JP | 2009-289818 A | 12/2009 |
| JP | 2012-023120 A | 2/2012 |
| JP | 2012-047503 A | 3/2012 |
| JP | 2013-197248 A | 9/2013 |
| JP | 2014-209536 A | 6/2014 |
| JP | 2015-132524 A | 7/2015 |

\* cited by examiner

APPARATUS AND METHOD FOR EVALUATING SEMICONDUCTOR DEVICE

BACKGROUND OF THE INVENTION

Field

The present invention relates to an apparatus and method for evaluating a semiconductor device which can easily accurately inspect the in-plane positions and temperatures of the distal end portions of a plurality of probes.

BACKGROUND

In a semiconductor wafer or chips obtained by cutting a semiconductor wafer into pieces, the electric characteristics of each semiconductor device serving as an object to be measured is evaluated. In this case, after an installation surface of the object to be measured is brought into contact with a surface of a chuck stage and fixed thereto by vacuum suction or the like, a probe to perform an electric input/output operation is brought into contact with an electrode formed on a part of a non-installation surface of the object to be measured. In inspection of a semiconductor device having a vertical structure which causes a large current to the device in a vertical direction (out-of-plane direction), a chuck stage serves as an electrode. From the past, the number of pins of a probe is increased to meet a request of application of a large current and a high voltage.

In evaluation of the electric characteristics of a semiconductor device, accurate contact of a plurality of probes to an electrodes formed on a surface of a semiconductor device is important. Misalignment of the distal end portion of a probe to be in contact with an electrode may prevent a desired current or voltage from being applied to a semiconductor device. In addition to this, contact of the probe to a portion except for the electrode may break the semiconductor device.

A short probe is desired to suppress the distal end portion of the probe from being misaligned. However, in order to suppress a discharge phenomenon, the probe tends to be elongated, and a distance between the main body of a probe guard and a semiconductor device tends to be increased. Thus, the distal end portion of the probe may be easily misaligned.

Under these circumstances, as a probe position measurement method, a contact-free method is known. For example, image processing measurement performed by a camera installed to face a probe is known. However, when the position of the distal end portion of a probe is to be measured, a plurality of disturbance factors such as a background or a distance, focusing on respective targets, and influences of attachments make it difficult to achieve accurate measurement.

For recent diversification of environments in which semiconductor devices are used, evaluation of electric characteristics in a wide temperature range from a low temperature to a high temperature is necessary. When a chuck stage located on the semiconductor device side is set at a low or high temperature, a temperature difference occurring between the chuck stage and a probe or a probe guard side causes thermal expansion or thermal contraction of the probe guard, and the distal end portion of the probe being in contact with the semiconductor device disadvantageously misaligned. Furthermore, when the probe is brought into contact with the semiconductor device while the temperature difference is kept, the temperature of the device is different from a set temperature to disadvantageously deteriorate the accuracy of the evaluation.

Methods of inspecting a probe position include a method which observes the position and size of a probe mark such that a probe is brought into contact with a deformable body and then separated from the deformable body (for example, see Japanese Unexamined Patent Publication No. 2001-189353) and a method of eliminating a needle mark of a needle mark transferring member (for example, see Japanese Unexamined Patent Publication No. 2009-198407) are disclosed. Inspection performed in a state in which a measurement probe is pressed against a transparent glass plate is also disclosed (for example, see Japanese Unexamined Patent Publication No. H05-157790).

As a method of evaluating a semiconductor device when the temperature of the semiconductor device is variable, a method in which a heating sheet on which a resistor is disposed is installed on a probe card to heat a probe circuit board is disclosed (for example, Japanese Unexamined Patent Publication No. 2012-47503). A method in which a halogen lamp is caused to face a probe circuit board and to irradiate light on the probe circuit board when a chuck is retreated so as to heat the probe circuit board (for example, see Japanese Unexamined Patent Publication No. 2012-23120) is also disclosed. A method in which a ceramics heater disposed on a printed circuit board configuring a probe card heats a probe circuit board is also disclosed (for example, see Japanese Unexamined Patent Publication No. 2002-196017).

However, probe inspection according to Japanese Unexamined Patent Publication No. 2001-189353 requires a reproducing process for a deformable body in every probe inspection. In addition, observation after transferring disadvantageously requires a long inspection time. The probe inspection is hard to be added to a conventional evaluation apparatus. Also in the needle mark transferring member in Japanese Unexamined Patent Publication No. 2009-198407, although it is described that the mark is recovered within a short period of time, a reproducing process is still required. Furthermore, observation after transferring disadvantageously requires a long inspection time. In the technique of Japanese Unexamined Patent Publication No. H05-157790, a disturbance such as illumination or a background deteriorates inspection accuracy.

Any of the Patent Documents does not describe temperature detection of the distal end portion of a probe being in contact with a semiconductor device. Since measurement by a temperature sensor installed in each apparatus targets the temperature of a probe circuit board, a temperature difference between the probe and the semiconductor device is unknown, and deterioration in evaluation accuracy caused by the temperature difference poses a problem.

Only expansion and contraction of a probe circuit board are problematically handled in terms of the in-plane position of the distal end portion of a probe being in contact with a semiconductor device. An initial positional defect of the probe occurring when a probe is installed on a probe circuit board and misalignment at a variable temperature cannot be checked immediately before evaluation of a semiconductor device.

SUMMARY

The present invention has been made to solve the above problems, and has as its object to obtain an apparatus and method for evaluating a semiconductor device which can easily accurately inspect the in-plane positions and temperatures of distal end portions of a plurality of probes.

According to the present invention, an apparatus for evaluating a semiconductor device includes: a chuck stage for fixing a semiconductor device; an insulating substrate; a plurality of probes fixed to the insulating substrate; a temperature adjustment unit adjusting temperatures of the plurality of probes; an evaluation/control unit causing a current to flow into the semiconductor device through the plurality of probes to evaluate an electric characteristic of the semiconductor device; and a probe position/temperature inspection device including an inspection plate, a thermo-chromic material disposed on an upper surface or a lower surface of the inspection plate, a photographing unit, and an image processing unit, wherein the photographing unit photographs a color-change image of the thermo-chromic material in a state in which distal end portions of the plurality of probes are pressed against the upper surface of the inspection plate, and the image processing unit performs image processing to the color-change image to calculate in-plane positions and temperatures of the distal end portions of the plurality of probes.

In the present invention, the color-change image of the thermo-chromic material is photographed in the state in which the distal end portions of the plurality of probes are pressed against the upper surface of the inspection plate, the color-change image is processed to calculate the in-plane positions and temperatures of the distal end portions of the plurality of probes. Therefore, the in-plane positions and the temperatures of the distal end portions of the plurality of probes can be easily accurately inspected.

Other and further objects, features and advantages of the invention will appear more fully from the following description.

DESCRIPTION OF EMBODIMENTS

An apparatus and method for evaluating a semiconductor device according to the embodiments of the present invention will be described with reference to the drawings. The same components will be denoted by the same symbols, and the repeated description thereof may be omitted.

First Embodiment

Figure 1:
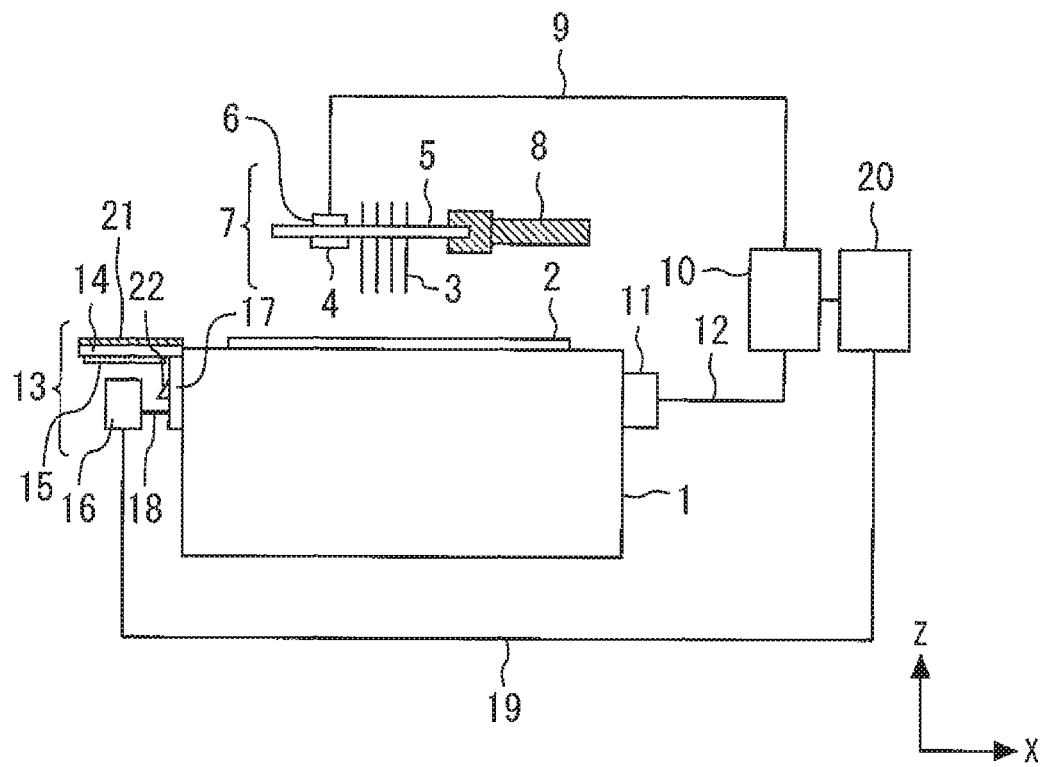
FIG. 1 is a schematic view showing an apparatus for evaluating a semiconductor device according to a first embodiment of the present invention.

FIG. 1 is a schematic view showing an apparatus for evaluating a semiconductor device according to a first embodiment of the present invention. A chuck stage 1 fixes a semiconductor device 2 serving as an object to be evaluated thereon. The chuck stage 1 is a pedestal which is brought into contact with an installation surface (rear surface) of the semiconductor device 2 to fix the semiconductor device 2. A means for fixing the semiconductor device 2 is, for example, vacuum suction. However, the vacuum suction need not always be used, and electrostatic adsorption or the like may be used.

The semiconductor device 2 is a semiconductor wafer on which a plurality of semiconductor chips are formed or a semiconductor chip itself. In this embodiment, the semiconductor device 2 has a vertical structure in which a large current is caused to flow in a vertical direction (out-of-plane direction) of the device. However, the semiconductor device 2 need not always have the vertical structure, and may be a semiconductor device having a lateral structure in which an input/output operation is performed on one surface of the semiconductor device.

A plurality of probes 3 and a temperature adjustment unit 4 are fixed to an insulating substrate 5. The plurality of probes 3 and the temperature adjustment unit 4 are connected to a connection unit 6 by a wire (not shown) such as a metal plate formed on the insulating substrate 5. The plurality of probes 3, the temperature adjustment unit 4, the insulating substrate 5, the connection unit 6, and the wire (not shown) constitute a probe base unit 7. The probe base unit 7 can be moved in an arbitrary direction by a moving arm 8. The probe base unit 7 is configured to be held by one moving arm 8 here. However, the configuration need not always be used, and the probe base unit 7 may be stably held by a plurality of moving arms. In addition, the probe base unit 7 need not always be moved, and the chuck stage 1 and the semiconductor device 2 may be moved.

In evaluation of the semiconductor device 2 having the vertical structure, the plurality of probes 3 are electrically connected to front-surface electrodes disposed on a front surface of the semiconductor device 2, and the chuck stage 1 is electrically connected to a rear-surface electrode disposed on a rear surface of the semiconductor device 2.

The temperature adjustment unit 4 adjusts the temperatures of the plurality of probes 3. The temperature adjustment unit 4, for example, as described in Japanese Unexamined Patent Publication No. 2013-229496, has an electrically heated wire winded on the probes 3 or a socket in which the probes 3 are disposed and a control unit for the electrically heated wire. However, this configuration need not be always used, and the temperature adjustment unit 4 may have another configuration.

The connection unit 6 of the insulating substrate 5 is connected to an evaluation/control unit 10 through a signal line 9. A surface of the chuck stage 1 is connected to the evaluation/control unit 10 through a connection unit 11 disposed on a side surface of the chuck stage 1 and a signal line 12. The evaluation/control unit 10 causes a current to flow into the semiconductor device 2 through the plurality of probes 3 to evaluate the electric characteristics of the semiconductor device 2.

The number of probes 3 for evaluation is set to two or more on the assumption that a large current (for example, 5A or more) is applied. In order to make current densities applied to the probes 3 equal to each other, distances between the connection unit 6 of the insulating substrate 5 and the connection unit 11 of the chuck stage 1 through the probes 3 are desired to be equal to each other. Thus, the connection unit 6 and the connection unit 11 are desired to be disposed at positions facing each other through the probes 3.

Figure 2:
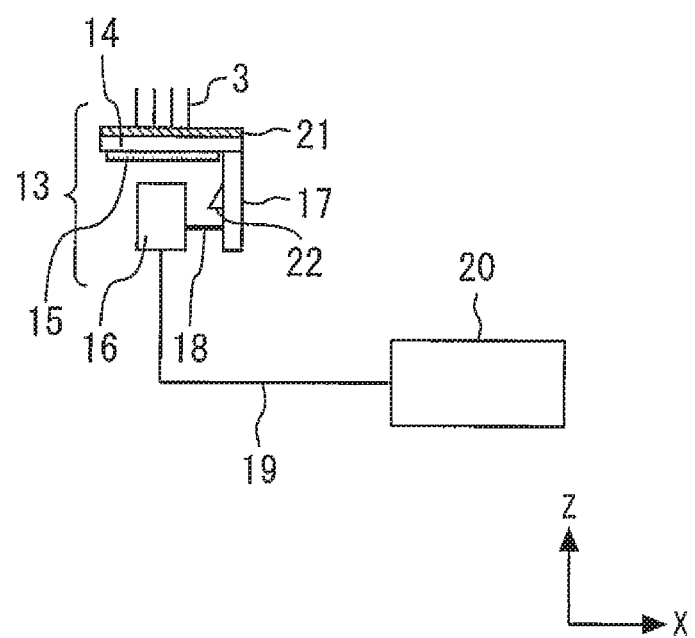
FIG. 2 is a schematic block diagram of a probe position/temperature inspection device according to a first embodiment of the present invention in a probe contact state.

FIG. 2 is a schematic block diagram of a probe position/temperature inspection device according to a first embodiment of the present invention in a probe contact state. Note that an insulating substrate 5 or the like to which a plurality of probes 3 are fixed is not shown.

A probe position/temperature inspection device 13 mainly includes an inspection plate 14, a thermo-chromic material 15 disposed on the lower surface of the inspection plate 14, a photographing unit 16, and a base unit 17 supporting these components.

The inspection plate 14 is made of a heat conductive material. Since the probes 3 are repeatedly pressed against the inspection plate 14 every inspection, the inspection plate 14 must be made of a material having strength to avoid the inspection plate from being broken. For example, the inspection plate 14 is a plate made of a metal material and having a thickness of several millimeters.

The thermo-chromic material 15 is a material the color of which naturally changes depending on a change in temperature caused by heating or cooling. A pigment exhibits such a nature is called a thermo-chromic pigment. Inorganic thermo-chromic pigments, bianthrones, spiro-oxazines, salicylideneanilines, and the like are given. However the thermo-chromic material 15 is not limited to these materials. The thermo-chromic material 15 includes various forms. For example, as the thermo-chromic material 15, a seal-like material may be attached to the inspection plate 14, or a spray-like material may be applied to the inspection plate 14 by splaying.

The photographing unit 16 is fixed to the base unit 17 through a fixing arm 18 and coupled to an image processing unit 20 through a signal line 19. A protecting member 21 is disposed on the upper surface of the inspection plate 14 against which the distal end portions of the probes 3 are pressed. The protecting member 21 has a hardness lower than the distal end portions of the probes 3. The protecting member 21 is preferably made of a flexible sheet material which can be easily replaced. The protecting member 21, which may be a PVC sheet, for example, is not limited to the PVC sheet.

The photographing unit 16 is a camera, for example, a CCD camera which is disposed to face the thermo-chromic material 15 and photographs a color-change image of the thermo-chromic material 15 in a state in which the distal end portions of the plurality of probes 3 are pressed against the upper surface of the inspection plate 14. In this case, when the distal end portions of the plurality of heated probes 3 are pressed against the upper surface of the inspection plate 14, heat of the distal end portions of the probes 3 changes the thermo-chromic material 15 in color.

The image processing unit 20 performs image processing (image recognition) to the photographed color-change image to calculate the in-plane positions and temperatures of the distal end portions of the plurality of probes 3. As a cooler cooling the inspection plate 14 and the thermo-chromic material 15, a blower 22 blowing the inspection plate 14 and the thermo-chromic material 15 is disposed on a wall surface of the base unit 17.

Figure 3:
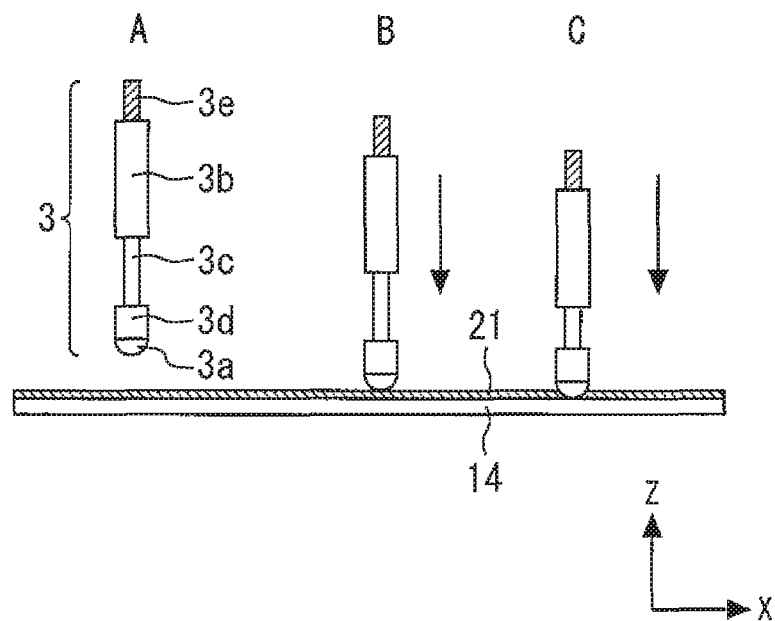
FIG. 3 is a side view for explaining an operation of the probes.

FIG. 3 is a side view for explaining an operation of the probes. Each of the probes 3 includes a distal end portion 3a being in mechanical and electric contact with a surface electrode of the semiconductor device 2, a barrel portion 3b serving as a base fixed to the insulating substrate 5, a plunger portion 3d including a depression portion 3c which can be slid when being in contact with the electrode through a spring member such as a spring built in the semiconductor device, and an electric coupling portion 3e electrically coupled to the plunger portion 3d to serve as an output terminal for the outside. The probes 3 are made of a metal material such as copper, tungsten, or rhenium tungsten having electric conduction property. However, the material of the probe is not limited to these materials. In particular, the distal end portion 3a may be covered with another member such as gold, palladium, tantalum, or platinum in terms of improvement of conductivity, improvement of durability, and the like.

When the probes 3 in an initial state in FIG. 3A are moved downward along a Z axis toward the protecting member 21 disposed on the upper surface of the inspection plate 14, the protecting member 21 and the distal end portions 3a are brought into contact with each other as shown in FIG. 3B. When the probes are further moved downward, as shown in FIG. 3C, the depression portions 3c are depressed into the barrel portions 3b through spring members, respectively, to make it reliable to bring the depression portions 3c into contact with the protecting member 21 disposed on the upper surface of the inspection plate 14.

In this case, each of the probes 3 has a spring portion built therein and slidablility in the Z-axis direction. However, the probes 3 are not limited to the configurations, and may include external spring portions. The probes 3 are of a spring type in terms of discharge suppression. However, the probes 3 are not limited to this type, and may be of a cantilever-type, multi-layered probes, wire probes, or the like.

Figure 4:
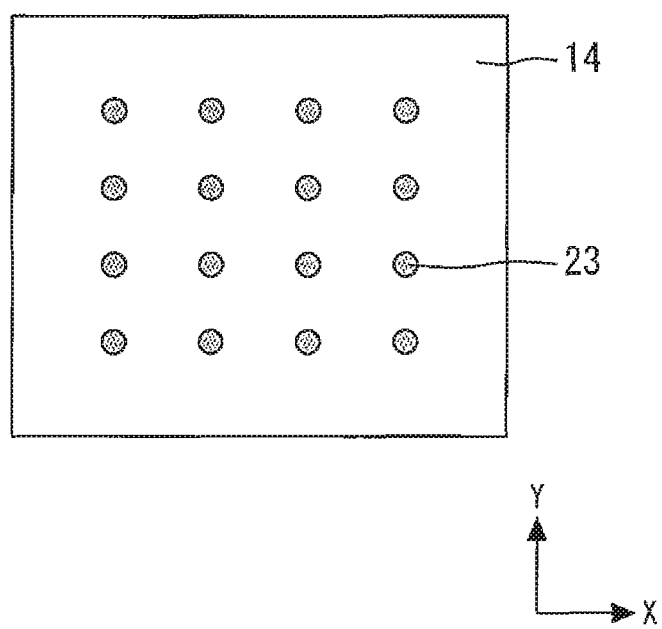
FIG. 4 is a diagram showing a color-change image obtained when 16 probes at normal positions are pressed against the inspection plate.
Figure 5:
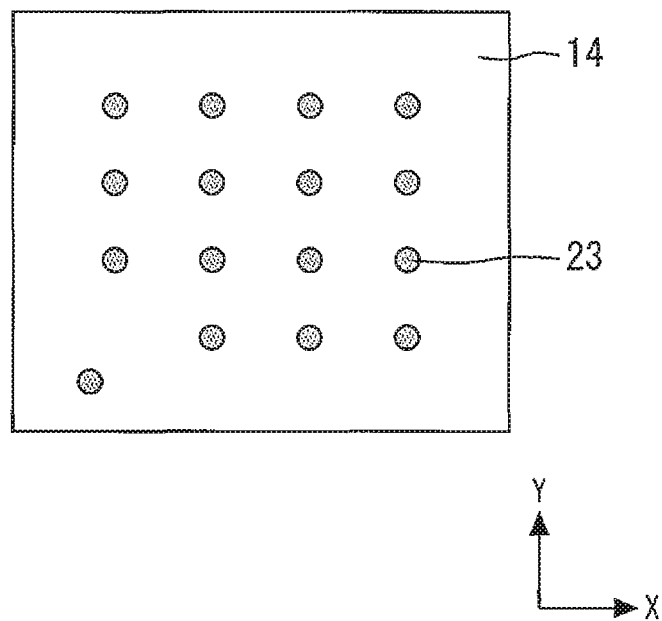
FIG. 5 is a diagram showing a color-change image obtained when some probes are located at abnormal positions are against the inspection plate.

FIG. 4 is a diagram showing a color-change image obtained when 16 probes at normal positions are pressed against the inspection plate. When the distal end portions 3a of the probes 3 heated to a high temperature are pressed against the inspection plate 14, only portions against which the probes 3 are pressed increase in temperature to cause a difference between temperature distributions of the thermo-chromic material 15. For this reason, the portions against the probes 3 are pressed change in color and are photographed as a probe thermal image 23. FIG. 5 is a diagram showing a color-change image obtained when some probes are located at abnormal positions are against the inspection plate. A failure occurs at a probe position at the lower left of FIG. 5. When the failure at the probe position is detected, alarm is transmitted from the image processing unit 20 to the evaluation/control unit 10, subsequent evaluation processing is suspended, and the probes 3 are inspected.

Subsequently, an operation procedure of an evaluation device for semiconductor device according to the embodiment will be described. The semiconductor device 2 is fixed to the chuck stage 1 such that an installation surface of the semiconductor device 2 is in contact with the chuck stage 1. The semiconductor device 2 is then heated to an evaluation temperature with a heater disposed on the chuck stage 1. The plurality of probes 3 are also heated to an evaluation temperature with a temperature adjustment unit. The plurality of heated probes 3 are moved onto the inspection plate 14 and pressed against the upper surface of the inspection plate 14 with the same load as that in evaluation. In this state, a color-change image of the thermo-chromic material 15 is photographed with the photographing unit 16. The image processing unit 20 performs image processing to the color-change image to calculate in-plane positions and temperatures of the distal end portions of the plurality of probes 3. In this manner, before electric evaluation for the semiconductor device 2, the positions and temperatures of the distal end portions of the plurality of probes 3 are inspected.

When the in-plane positions or the temperatures of the distal end portions of the plurality of probes 3 include some abnormal position or temperature, the evaluation of electric characteristics is not started, the evaluation processing is interrupted, and the probes 3 are inspected. When there is no abnormality, the plurality of probes 3 are moved to a position above the semiconductor device 2, the distal end portions of the plurality of probes 3 are brought into contact with the electrode of the semiconductor device 2, the evaluation/control unit 10 causes a current to flow in the semiconductor device 2 through the plurality of probes 3 to evaluate the electric characteristics of the semiconductor device 2.

The probe positions and temperatures are inspected, and the distal end portions of the plurality of heated probes 3 are separated from the inspection plate 14, and the inspection plate 14 is cooled with blowing by the blower 22. The inspection of the probe positions and temperatures is performed for each semiconductor device to be evaluated or at a predetermined frequency, for example, every replacement of the probes 3.

As described above, in the embodiment, the image of the thermo-chromic material 15 is photographed in the state in which the distal end portions of the plurality of probes 3 are pressed against the upper surface of the inspection plate 14, the resultant image is processed to calculate the in-plane positions and temperatures of the distal end portions of the plurality of probes. In this case, the evaluation for the semiconductor device 2 is performed in the state in which the plurality of probes 3 are pressed against the surface electrode disposed on the surface of the semiconductor device 2. Thus, when the probe positions and temperatures are inspected in the state in which the distal end portions of the plurality of probes 3 are pressed against the upper surface of the inspection plate 14, the probe positions and temperatures can be inspected in a state approximate to that in evaluation of the electric characteristics of the semiconductor device 2. For this reason, the positions of the distal end portions of the plurality of probes 3 in evaluation for the semiconductor device 2 can be recognized. Furthermore, the heights of the distal end portions of the plurality of probes 3 are allowed to vary. Since the color change of the thermo-chromic material 15 is used, in comparison with detection performed by directly photographing the probes, disturbance elements such as a background can be efficiently excluded to make it easy to improve inspection accuracy. Since probe marks are not used, the inspection can be performed without using a deformable body or a needle mark transfer unit are not required while the disturbance elements are suppressed. The temperatures of the distal end portions of the probes 3 being in direct contact with the semiconductor device 2 can also be inspected at once. As a result, the in-plane positions and temperatures of the distal end portions of the plurality of probes 3 can be easily inspected at high accuracy. Furthermore, the accuracy of evaluation for the semiconductor device performed after the inspection is also improved. The probe position/temperature inspection device 13 can be independently used. However, the probe position/temperature inspection device 13 can be easily added to a conventional evaluation device, a conventional evaluation device for semiconductor device can be used without change.

Furthermore, a normal CCD camera or the like can be used as the photographing unit 16 to make it possible to achieve an inexpensive configuration.

The thermo-chromic material 15 is disposed on the lower surface of the inspection plate 14. In this manner, since the state in which the distal end portions of the plurality of probes 3 are pressed against the surface can be inspected on real time, accurate inspection can be achieved.

The temperature of the inspection plate 14 with which the heated probes 3 are brought into contact does not return to room temperature immediately after the probes 3 are separated from the inspection plate 14. If the next inspection is immediately performed, an error caused by temperature history deteriorates inspection accuracy. Thus, after the heated probes 3 are separated from the inspection plate 14 after inspection, the inspection plate 14 is forcible cooled with the blower 22. In this manner, the accuracy of the next inspection can be maintained without being influenced by the previous inspection. In addition, when the inspection plate 14 is cooled in advance, even in room-temperature measurement performed without heating the probes 3, probe positions can be inspected. This configuration need not be always used, and, as a cooler, an aluminum member (heat sink) having a heat-radiation fin may be disposed on the inspection plate 14. This member need not be always installed, and may be configured to be brought into contact with the inspection plate 14 only after the probes 3 are separated from the inspection plate 14. The blower 22 and the heat-radiation fin can be easily disposed at low cost.

The protecting member 21 protects the surface of the inspection plate 14 against which the distal end portions of the probes 3 are pressed every inspection, and can also protect the distal end portions of the probes 3. When the protecting member 21 is damaged, the protecting member 21 need only be replaced, and the inspection plate 14 need not be replaced.

Since the inspection plate 14 is made of a high-strength metal material, the inspection plate 14 is not easily broken even though the probes 3 are repeatedly pressed against the inspection plate 14 and need not be replaced to achieve a low cost. Since the inspection plate 14 is excellent in heat conductivity, the inspection plate 14 can be measured within a short period of time even though a camera is disposed on the lower surface of the inspection plate 14. However, this configuration need not be always used, the inspection plate 14 may be made of a ceramic material. When a high-strength ceramic material is used, the inspection plate 14 is hard to be broken even though the probes 3 are repeatedly pressed against the inspection plate 14, and the inspection plate 14 need not be replaced to achieve a low cost. When ceramics which is excellent in heat conductivity are selected, the inspection plate 14 can be measured within a short period of time even though a camera is disposed on the lower surface.

The inspection plate 14 may be made of a thermally anisotropic material having thermal anisotropy regulating a direction of heat conduction to the Z direction. Since heat can be suppressed from spreading in the plane of the inspection plate 14, the positions of the distal end portions of the probes 3 can be measured at high accuracy. As the thermal anisotropic material, for example, Comporoid (available from Thermo Graphics Co., Ltd.) is given. This material need not always be used.

The inspection plate 14 and the base portion 17 are made of the same material and integrated with each other to make it possible to reduce the cost, and the inspection plate 14 can be easily disposed on a side surface of the chuck state 1.

When a metal material is selected as the material, the inspection plate can be fabricated by bending work.

The image processing unit 20 and the probe position/temperature inspection device 13 is achieved by a processing circuit such as a CPU or a system LSI executing a program stored in a memory. A plurality of processing circuits may cooperate with each other to execute the functions described above.

In order to improve the accuracy of the thermo-chromic material 15 in photographing, an illumination unit irradiating light on the thermo-chromic material 15 is preferably disposed. In order to prevent the disturbance element from being reflected, an anti-reflection film or an anti-reflection coat is preferably formed on a photographing surface of the thermo-chromic material 15.

Second Embodiment

Figure 6:
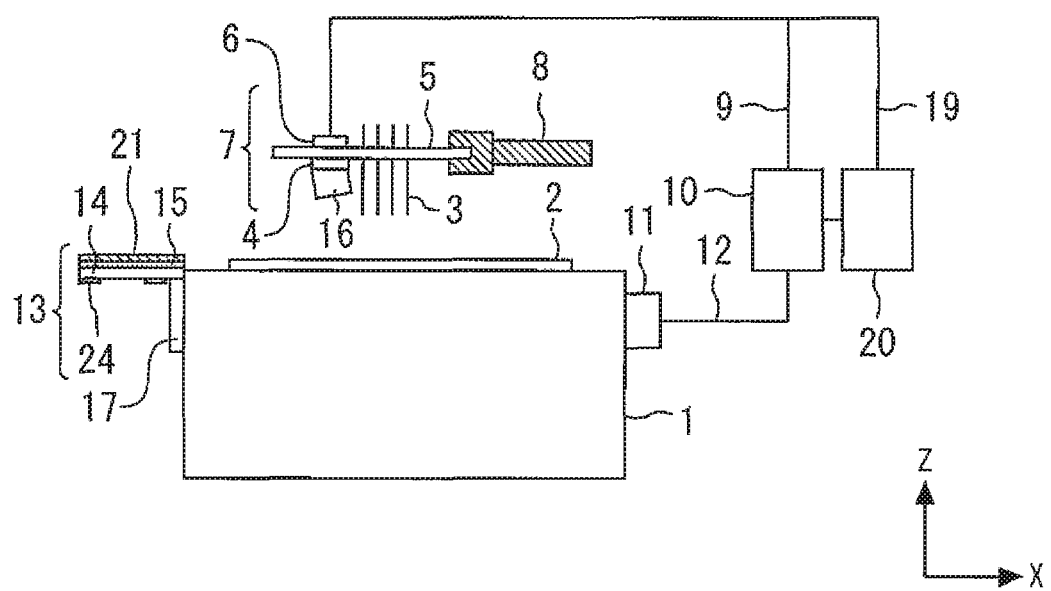
FIG. 6 is a schematic view showing an evaluation device for semiconductor device according to a second embodiment of the present invention.
Figure 7:
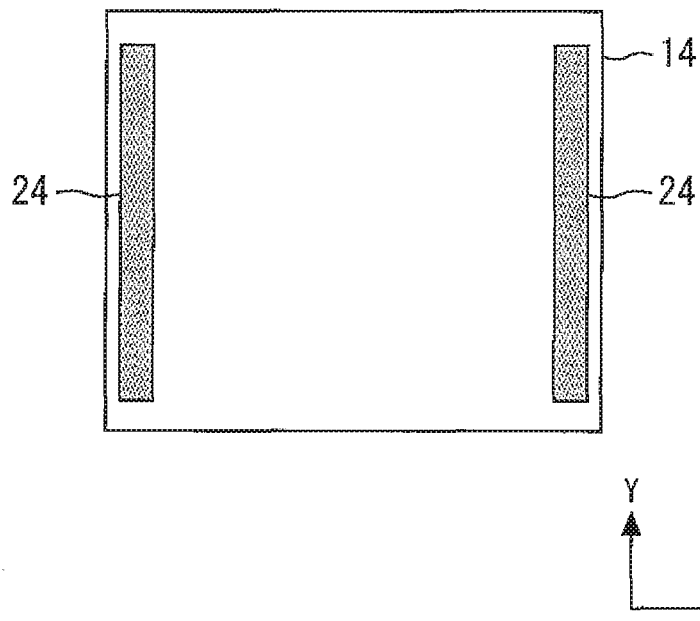
FIG. 7 is a lower view showing an inspection substrate according to the second embodiment of the present invention.

FIG. 6 is a schematic view showing an evaluation device for semiconductor device according to a second embodiment of the present invention. FIG. 7 is a lower view showing an inspection substrate according to the second embodiment of the present invention.

The inspection plate 14 is the same as the member as in the first embodiment. However, peltier elements 24 serving as coolers cooling the inspection plate 14 are disposed on both the sides of a rear-surface side of the inspection plate 14 with which the probes 3 are not in contact. The peltier elements allow the device to be miniaturized.

The thermo-chromic material 15 is disposed on the upper surface of the inspection plate 14, and the photographing unit 16 is disposed on the insulating substrate 5. Since a state in which the distal end portions of the probes 3 are pressed against the inspection plate 14 are difficult to be measured because the inspection plate 14 is blocked, the measurement is performed after the probes 3 are separated. Although real-time inspection is impossible, the wires 9 and 19 are collected near the insulating substrate 5 to make it possible to make the entire device compact.

In inspection for the heated probes 3 is performed, the peltier elements 24 are used to cool the inspection plate 14 after the inspection. On the other hand, when the room-temperature probes 3 are inspected without being heated, the peltier elements 24 are used to cool the inspection plate 14 before the inspection. When the room temperature probes 3 are brought into contact with the inspection plate 14 and the thermo-chromic material 15 which are cooled before the inspection, the temperatures of the contact portions increase to generate a difference between temperature distributions on the surface of the thermo-chromic material 15. In this case, the temperatures of the distal end portions of the probes 3 are not matter, the positions of the probes 3 are detected based on the difference between the temperature distributions.

According to the embodiment, the in-plane positions and temperatures of the distal end portions of the plurality of probes 3 can be easily inspected at high accuracy before a semiconductor is evaluated as in the first embodiment. Not only when the probes 3 are heated or cooled, but also when the probes 3 are evaluated at room temperature, the same effect as described above can be obtained.

Figure 8:
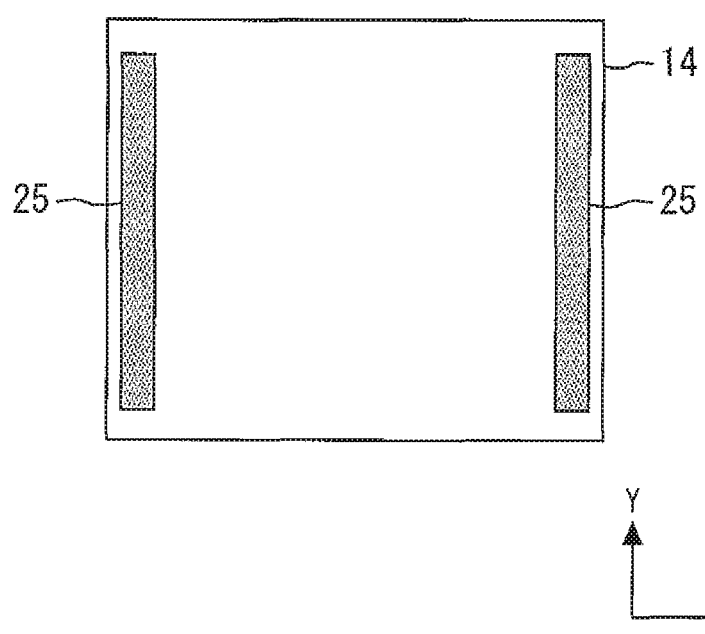
FIG. 8 is a lower view showing a modification of an inspection substrate according to the second embodiment of the present invention.

FIG. 8 is a lower view showing a modification of an inspection substrate according to the second embodiment of the present invention. In place of the peltier elements 24, heaters 25 heating the inspection plate 14 are disposed on both the sides of the inspection plate 14. When the inspection plate 14 is heated in advance before the inspection, the probes 3 can be inspected at room temperature by the same matter as described above.

The peltier elements 24 and the heaters 25 may be disposed on either the upper surface or the lower surface of the inspection plate 14 unless the peltier elements 24 and the heaters 25 block a color-change image from being acquired by the photographing unit 16. The disposed positions are not limited to both the sides, and the peltier elements 24 or the heaters 25 may be disposed to surround an acquiring portion of the color-change image. An increase in number of peltier elements or heaters allows a heating or cooling time to be shortened.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-224663, filed on Nov. 17, 2015 including specification, claims, drawings and summary, on which the Convention priority of the present application is based, is incorporated herein by reference in its entirety.

The invention claimed is:

1. An apparatus for evaluating a semiconductor device comprising:
    a chuck stage for fixing a semiconductor device;
    an insulating substrate;
    a plurality of probes fixed to the insulating substrate;
    a temperature adjustment unit adjusting temperatures of the plurality of probes;
    an evaluation/control unit causing a current to flow into the semiconductor device through the plurality of probes to evaluate an electric characteristic of the semiconductor device; and
    a probe position/temperature inspection device including an inspection plate, a thermo-chromic material disposed on an upper surface or a lower surface of the inspection plate, a photographing unit, and an image processing unit,
    wherein the photographing unit photographs a color-change image of the thermo-chromic material in a state in which distal end portions of the plurality of probes are pressed against the upper surface of the inspection plate, and
    the image processing unit performs image processing to the color-change image to calculate in-plane positions and temperatures of the distal end portions of the plurality of probes.

2. The apparatus for evaluating a semiconductor device of claim 1, wherein the thermo-chromic material is disposed on the lower surface of the inspection plate.

3. The apparatus for evaluating a semiconductor device of claim 1, wherein the thermo-chromic material is disposed on the upper surface of the inspection plate and the photographing unit is disposed on the insulating substrate.

4. The apparatus for evaluating a semiconductor device of claim 1, further comprising an illumination unit irradiating light on the thermo-chromic material.

5. The apparatus for evaluating a semiconductor device of claim 1, further comprising an anti-reflection film on a photographing surface of the thermo-chromic material.

6. The apparatus for evaluating a semiconductor device of claim 1, further comprising an anti-reflection coat on a photographing surface of the thermo-chromic material.

7. The apparatus for evaluating a semiconductor device of claim 1, further comprising a protecting member disposed on the upper surface of the inspection plate and having a hardness lower than that of the distal end portions of the plurality of probes.

8. The apparatus for evaluating a semiconductor device of claim 1, further comprising a cooler cooling the inspection plate.

9. The apparatus for evaluating a semiconductor device of claim 8, wherein the cooler includes a peltiert element disposed on the inspection plate.

10. The apparatus for evaluating a semiconductor device of claim 1, further comprising a heater heating the inspection plate.

11. The apparatus for evaluating a semiconductor device of claim 1, wherein the inspection plate is made of a metal material.

12. The apparatus for evaluating a semiconductor device of claim 1, wherein the inspection plate is made of a ceramics material.

13. The apparatus for evaluating a semiconductor device of claim 1, wherein the inspection plate is made of a thermal anisotropic material.

14. A method for evaluating a semiconductor device comprising:
   heating a plurality of probes fixed to an insulating substrate by a temperature adjustment unit;
   photographing a color-change image of a thermo-chromic material disposed on an upper surface or a lower surface of the inspection plate with a photographing unit in a state in which distal end portions of the plurality of probes are pressed against the upper surface of the inspection plate;
   performing image processing to the color-change image by the image processing unit to calculate in-plane positions and temperatures of the distal end portions of the plurality of probes; and
   when the in-plane positions or the temperatures of the plurality of probes are normal, bringing the distal end portions of the plurality of probes into contact with electrodes of a semiconductor device and causing a current into the semiconductor device through the plurality of probes by an evaluation/control unit to evaluate an electric characteristic of the semiconductor device.

15. The method for evaluating a semiconductor device of claim 14, further comprising, after separating the distal end portions of the plurality of heated probes from the inspection plate, cooling the inspection plate by a cooler.

* * * * *